United States Patent
Futakuchi et al.

(12)

(10) Patent No.: US 6,351,055 B1
(45) Date of Patent: Feb. 26, 2002

(54) COMPOSITE PIEZOELECTRIC COMPONENT AND CHIP-TYPE COMPOSITE PIEZOELECTRIC COMPONENT

(75) Inventors: Tomoaki Futakuchi; Hisayuki Hashimoto, both of Takaoka (JP)

(73) Assignee: Yurata Manufacturing Co., LTD

( * ) Notice: Subject to any disclaimer, the term of this patent is extended or adjusted under 35 U.S.C. 154(b) by 0 days.

(21) Appl. No.: 09/536,003

(22) Filed: Mar. 23, 2000

(30) Foreign Application Priority Data

Mar. 26, 1999 (JP) .......................................... 11-084311

(51) Int. Cl.$^7$ ............................................. H01L 41/04
(52) U.S. Cl. ...................... 310/320; 310/348; 310/366
(58) Field of Search ................................ 310/320, 365, 310/366, 348

(56) References Cited

U.S. PATENT DOCUMENTS

| | | | | |
|---|---|---|---|---|
| 5,117,147 A | * | 5/1992 | Yoshida | 310/320 |
| 5,118,980 A | * | 6/1992 | Takahashi | 310/320 |
| 5,121,024 A | * | 6/1992 | Seto | 310/320 |
| 5,717,365 A | | 2/1998 | Kaida et al. | 310/348 |
| 5,898,348 A | * | 4/1999 | Ikeda | 333/191 |

FOREIGN PATENT DOCUMENTS

| | | | |
|---|---|---|---|
| DE | 197 39 495 A 1 | | 7/1998 |
| JP | 63-187908 | * | 8/1988 |
| JP | 04-192909 | * | 7/1992 |
| JP | 04-217108 | * | 8/1992 |
| JP | 06-326546 | | 11/1994 |

* cited by examiner

*Primary Examiner*—Nestor Ramirez
*Assistant Examiner*—Peter Medley
(74) *Attorney, Agent, or Firm*—Keating & Bennett, LLP (57) ABSTRACT

A composite piezoelectric component includes a plurality of piezoelectric resonant elements. Each of the plurality of piezoelectric resonant elements includes a substrate having a first major surface and a second major surface disposed opposite to each other. A pair of vibrating electrodes is disposed on the first and second major surfaces, respectively, so as to oppose each other with the substrate disposed therebetween. A ground electrode which is connected to ground is disposed on at least one of the first and second major surfaces. The plurality of piezoelectric resonant elements are stacked on each other so that the major surface of one substrate opposes the major surface of another substrate. A conductive joining member electrically connects at least two of the vibrating electrodes and the ground electrode of the plurality of piezoelectric resonant elements and mechanically bonds the stacked piezoelectric resonant elements. Each of the substrates of the of the piezoelectric resonant elements other than the piezoelectric resonant element located on the top portion includes a plurality of piezoelectric substrate portions, a conductive material portion arranged between the plurality of piezoelectric substrate portions, with the ground electrodes being provided on the first and second major surfaces of the substrate in the conductive material portion. The plurality of ground electrodes of the piezoelectric resonant elements are electrically connected to one another via the conductive material portions and the conductive joining members.

21 Claims, 7 Drawing Sheets

COMPOSITE PIEZOELECTRIC COMPONENT AND CHIP-TYPE COMPOSITE PIEZOELECTRIC COMPONENT

BACKGROUND OF THE INVENTION

1. Field of the Invention

The present invention relates to a composite piezoelectric component such as a composite trap including a plurality of piezoelectric resonant elements, and more specifically, the present invention relates to a composite piezoelectric component having a structure in which a plurality of piezoelectric resonant elements are stacked and joined to each other via conductive joining members.

2. Description of the Related Art

Various composite piezoelectric components formed by electrically connecting a plurality of piezoelectric resonant elements are known.

Figure 6:
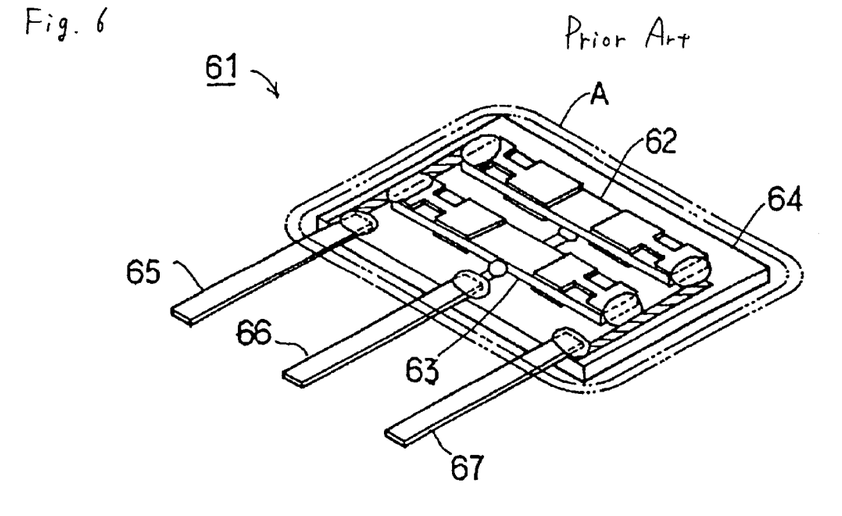
FIG. 6 is a perspective view showing an example of conventional composite piezoelectric components.

For example, Japanese Unexamined Patent Publication No.4-192909 discloses a composite trap as an example of such composite piezoelectric components. As shown in FIG. 6, this composite trap 61 includes a first trap element 62 formed of double-mode ceramic resonators having the same resonant frequencies and a second trap element 63 formed of double-mode ceramic resonators having resonant frequencies which are different from each other. The first trap element 62 and the second trap element 63 are mounted on a rectangular-shaped base substrate 64.

The first trap element 62 and the second trap element 63 are electrically connected to each other by electrodes provided on the base substrate 64. Furthermore, lead terminals 65 to 67 are joined to the electrodes on the base substrate 64. The entire composite trap except for a portion to which the lead terminals 65 to 67 are extended is covered by an exterior resin as shown by phantom lines "A".

In the composite trap 61, since the two elements, i.e., the first trap element 62 and the second trap element 63, are mounted next to each other on the base substrate 64, the overall size of the trap 61 is very large.

Japanese Unexamined Patent Publication No.4-192909 also discloses a composite trap having the first and second trap elements 62 and 63 stacked on each other and joined via a conductive joining member and a plurality of lead terminals connected thereto, and covered by an exterior resin. A special shaped lead terminal is used and arranged so as to be electrically connected to each terminal electrode to be connected to a ground of the first and second trap elements 62 and 63, having branches in the sides to be connected to the first and second trap elements 62 and 63. That is, each branch portion of the lead terminal is connected to each terminal electrode used to establish a ground for the first and second trap elements 62 and 63.

The composite trap requires the special shaped lead terminal which increases the cost and requires very difficult assembly processes.

Figure 7:
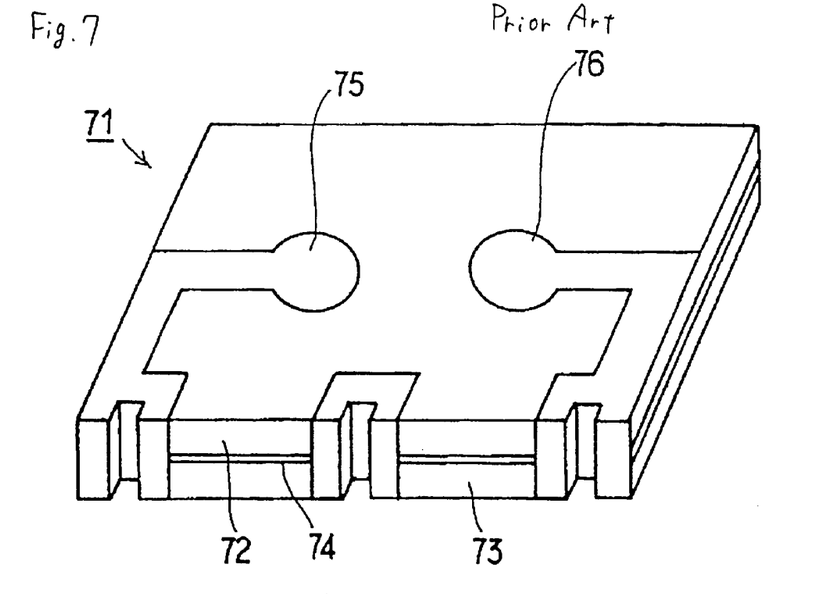
FIG. 7 is a perspective view showing another example of conventional composite piezoelectric components.

On the other hand, Japanese Unexamined Patent Publication No.6-326546 discloses a composite piezoelectric component 71 shown in FIG. 7. In this component, a plurality of piezoelectric substrates 72 and 73 are bonded together via adhesives 74.

Figure 8:
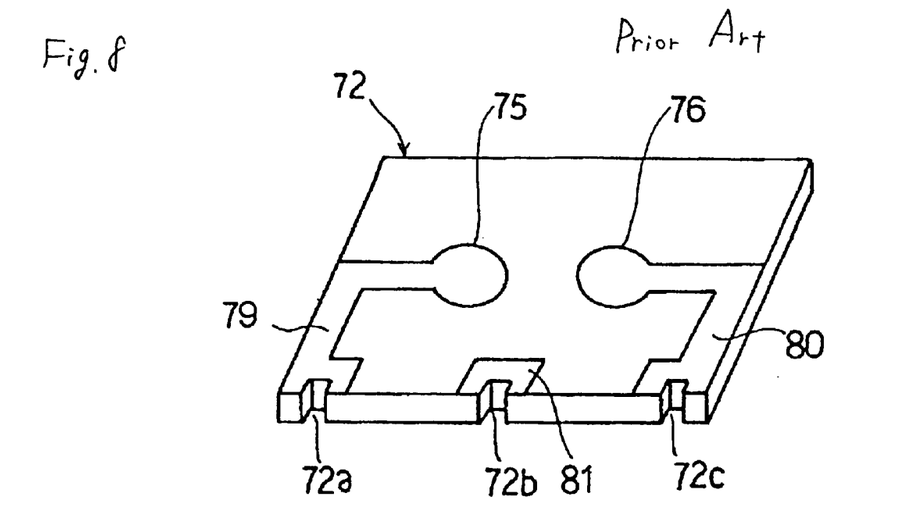
FIG. 8 is a perspective view showing a piezoelectric substrate used in the conventional composite piezoelectric component shown in FIG. 7, viewed from the top surface side.
Figure 9:
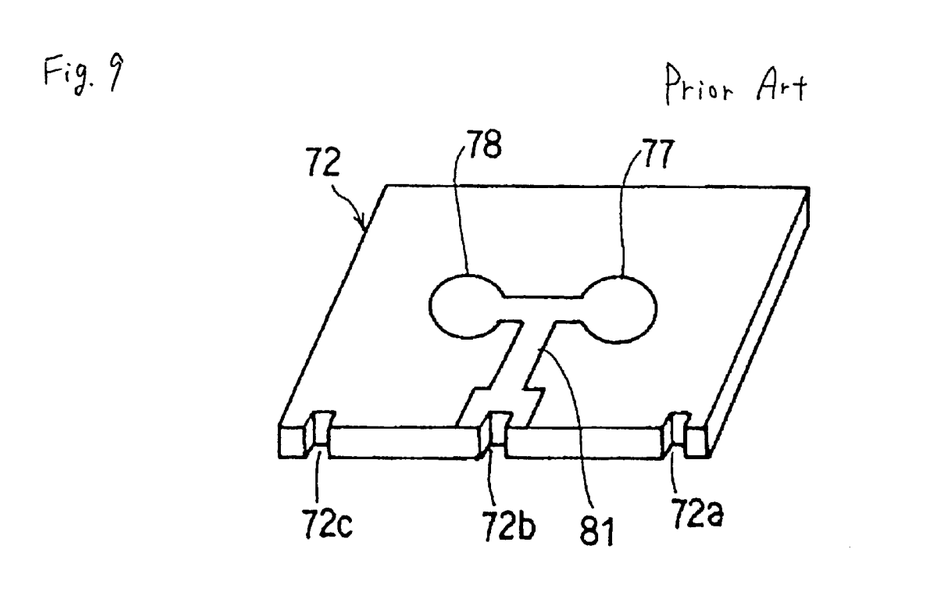
FIG. 9 is a perspective view showing the piezoelectric substrate shown in FIG. 8 viewed from the bottom surface side.

FIGS. 8 and 9 are perspective views showing electrodes formed on the top surface and the bottom surface of the piezoelectric substrate 72, respectively. On the top surface of the piezoelectric substrate 72, vibrating electrodes 75 and 76 are provided. On the bottom surface of the piezoelectric substrate 72, vibrating electrodes 77 and 78 are arranged so as to oppose the vibrating electrodes 75 and 76 at the front and the back with the piezoelectric substrate 72 disposed therebetween. A first piezoelectric vibrating unit is defined by the vibrating electrodes 75 and 77 while a second piezoelectric vibrating unit is defined by the vibrating electrodes 76 and 78. Similarly, two piezoelectric vibrating units are also included in the piezoelectric substrate 73.

On the one side edge of the piezoelectric substrate 72, a plurality of notches 72a to 72c are provided. Extending electrodes 79 and 80 are connected to the vibrating electrodes 75 and 76 so as to extend therefrom toward the insides of the notches 72a and 72c, respectively. An extending electrode 81 to be electrically connected to the vibrating electrodes 77 and 78 is disposed on the bottom surface of the piezoelectric substrate 72. The extending electrode 81 is arranged to extend to the inside of the notch 72b and in turn to extend toward the top surface of the substrate across the notch 72b.

In the composite piezoelectric component 71, the above-mentioned piezoelectric substrate 72 and the piezoelectric substrate 73 are joined together, although as for the piezoelectric substrate 73, the top surface thereof is the surface on which the vibrating electrodes 77 and 78 are disposed.

In the composite piezoelectric component 71, the piezoelectric substrates 72 and 73, each having two piezoelectric vibrating units, define a composite unit by being joined together. Since the two piezoelectric substrates 72 and 73 are deposited on each other to define the composite unit, the composite piezoelectric component having plural piezoelectric elements is miniaturized.

However, for the purpose of achieving the electrical connections of the two piezoelectric elements, i.e., the piezoelectric vibrating units disposed on the piezoelectric substrate 72 and 73 and the electrodes to be electrically connected to a ground, the above-mentioned notches 72a to 72c are used. That is, electrical connections are achieved by stacking the piezoelectric substrates 72 and 73 on each other such that the notches formed on the side edge of the piezoelectric substrate 72 are positioned on the corresponding notches formed on the side edge of the piezoelectric substrate 73 and then by forming electrode thin-films inside the notches via vapor deposition, sputtering, or other methods.

Therefore, the extending electrodes 79, 80, and 81 must be extended from the piezoelectric vibrating units to the notches 72a to 72c formed on the side edge. As a result, the sizes of the piezoelectric substrates 72 and 73 must be large.

In addition, this structure causes the reliability of the electrical connections to be insufficient. Consequently, breaking of the electrode thin-film is liable to occur at the edge portion facing to the notch.

Furthermore, in the composite piezoelectric component 71, the vibrating electrodes 75 and 76 are exposed on the top surface thereof. Therefore, in order to protect the piezoelectric vibrating units, a case member, or other protective member, must be disposed on the top surface of the composite piezoelectric component 71 so as to secure spaces for allowing for free vibration of the piezoelectric vibrating units, which prevents any reduction in the thickness and overall size of the component.

SUMMARY OF THE INVENTION

To overcome the above described problems, preferred embodiments of the present invention provide a composite piezoelectric component including a plurality of electrically connected piezoelectric elements, which achieves a significant reduction in size and a great increase in the reliability of electrical connections of the plurality of piezoelectric elements by solving the above-described problems of conventional techniques.

According to one preferred embodiment of the present invention, a composite piezoelectric component includes a plurality of piezoelectric resonant elements each including a substrate having a first major surface and a second major surface disposed opposite to each other, a pair of vibrating electrodes disposed on the first and second major surfaces, respectively, so as to oppose each other with the substrate disposed therebetween, a ground electrode connected to ground and disposed on at least one of the first and second major surfaces, and each of the plurality of piezoelectric resonant elements being stacked on each other so that the major surface of one substrate opposes the major surface of another substrate, a conductive joining member electrically connecting at least two of the vibrating electrodes and the ground electrode of the plurality of piezoelectric resonant elements and mechanically bonding the deposited piezoelectric resonant elements, each of the substrates of one of the piezoelectric resonant elements other than the piezoelectric resonant element deposited on the top portion including a plurality of piezoelectric substrate portions, a conductive material portion arranged between the plurality of piezoelectric substrate portions, the ground electrodes being provided on the first and second major surfaces of the substrate in the conductive material portion, and the plurality of ground electrodes of the piezoelectric resonant elements being electrically connected to one another via the conductive material portion and the conductive joining members.

In the above described composite piezoelectric component, the conductive material portion may be arranged substantially in the center of the substrate.

Also, at least one of the plurality of piezoelectric resonant elements may be a first trap element defined by a double-mode ceramic resonator, and at least one of the plurality of piezoelectric resonant elements may be a second trap element defined by a double-mode ceramic resonator having a resonant frequency that is different from that of the first trap element.

Further, each of the first and second trap elements may include two pairs of vibrating electrodes disposed on the first and second major surfaces, respectively, so as to oppose each other with the substrate disposed therebetween, and a ground electrode disposed on at least one of the first and second major surfaces of the substrate. The ground electrode is electrically connected to the vibrating electrodes disposed on the same surface and a terminal electrode is electrically connected to the vibrating electrodes which are not connected to the ground. The substrate of the trap element deposited at the bottom side in the first and second trap elements preferably includes first and second piezoelectric substrate portions and the conductive material portion arranged between the first and second piezoelectric substrate portions. The ground electrode is disposed on the first and second major surfaces of the substrate in the conductive material portion. The corresponding terminal electrodes of the first and second trap elements are electrically connected to each other.

The above described composite piezoelectric component may further include a lead terminal joined to the terminal electrode and a lead terminal joined to the ground electrode.

A composite piezoelectric component according to another preferred embodiment of the present invention may be a component having two terminals or may be a chip-type component.

That is, according to preferred embodiments of the present invention, a composite piezoelectric component preferably includes lead terminals joined to the terminal electrodes and a lead terminal joined to the ground electrode.

Another preferred embodiment of the present invention provides a chip-type composite piezoelectric component including a first case member on which a plurality of external electrodes are disposed, the composite piezoelectric component being mounted on the first case member, and a second case member connected to the first case member so as to surround the composite piezoelectric component mounted on the first case member.

In the composite piezoelectric component according to preferred embodiments of the present invention, a plurality of piezoelectric resonant elements are joined together and the ground electrode disposed on the bottom surface of the top piezoelectric resonant element is electrically connected to the ground electrodes located on the other piezoelectric resonant elements via the conductive joining members and the conductive material portions in the depositional direction. That is, only when plural piezoelectric resonant elements are joined together via the conductive joining members, the ground electrodes of plural piezoelectric resonant elements are securely electrically connected to each other.

Accordingly, at least when the electrode for being connected to. a ground is connected, the extending electrode and other elements are not required, thereby enabling the composite piezoelectric component to be miniaturized. The electrical connections of piezoelectric resonant elements are performed by utilizing the conductive joining members, and the conductive joining members make surface contact with a pair of electrodes to be joined, so that the reliability of electrical connection is greatly improved.

Therefore, a small-sized composite piezoelectric component having very reliable electrical connections is achieved.

According to preferred embodiments of the present invention, when the conductive material portion is arranged on the approximate center of the substrate, the substrate having the conductive material portion can be easily formed merely by cutting off a mother block which is obtained by deposition of the same shaped piezoelectric blocks via a conductive material.

When the plural piezoelectric resonant elements are defined by a first trap element including a double-mode piezoelectric resonator having the same resonant frequencies and a second trap element including a double-mode piezoelectric resonator having resonant frequencies different from those of the first trap element according to preferred embodiments of the present invention, a very small composite trap having very reliable electrical connections is achieved.

When each substrate of the trap element deposited in the bottom side in the first and second trap elements includes a first and a second piezoelectric substrate portion, and the conductive material portion arranged between the first and second piezoelectric substrate portions, and when the ground electrodes are located on the both principal surfaces of the substrate in the conductive material portion and the corresponding terminal electrodes of the first and second trap elements are electrically connected to each other, electrodes for being connected to a ground of the first and second trap elements are electrically connected to each other via the conductive joining members and the conductive material portions, thus, enabling the composite trap to have greatly improved reliability of the electrical connections and also to have a greatly reduced size.

When the composite trap includes a lead terminal connected to the terminal electrode and a lead terminal connected to the ground electrode, the composite piezoelectric component according to various preferred embodiments of the present invention provides an electronic component with leads.

When the composite piezoelectric component includes a first case member having a plurality of external electrodes disposed thereon, a composite piezoelectric component according to preferred embodiments of the present invention mounted on the first case member, and a second case member joined to the first case member so as to surround the composite piezoelectric component mounted on the first case member, this component is easily surface-mounted on a printed-circuit board or other substrate. Moreover, a very small chip-type composite piezoelectric component having very reliable electrical connections is provided.

Other elements, features, characteristics and advantages of the present invention will become apparent from the following description of preferred embodiments of the present invention which refers to the accompanying drawings.

BRIEF DESCRIPTION OF DRAWINGS

FIG. 2A, FIG. 2B and FIG. 2C are a plan view, a bottom plan view, and a side view of the piezoelectric resonator according to the first preferred embodiment, respectively, while

FIG. 3A and FIG. 3B are perspective views illustrating the process for manufacturing the substrate having the conductive material portion, while FIG. 3A shows a mother block and FIG. 3B illustrates a mother substrate formed by cutting off the mother block.

DETAILED DESCRIPTION OF PREFERRED EMBODIMENTS

Figure 1:
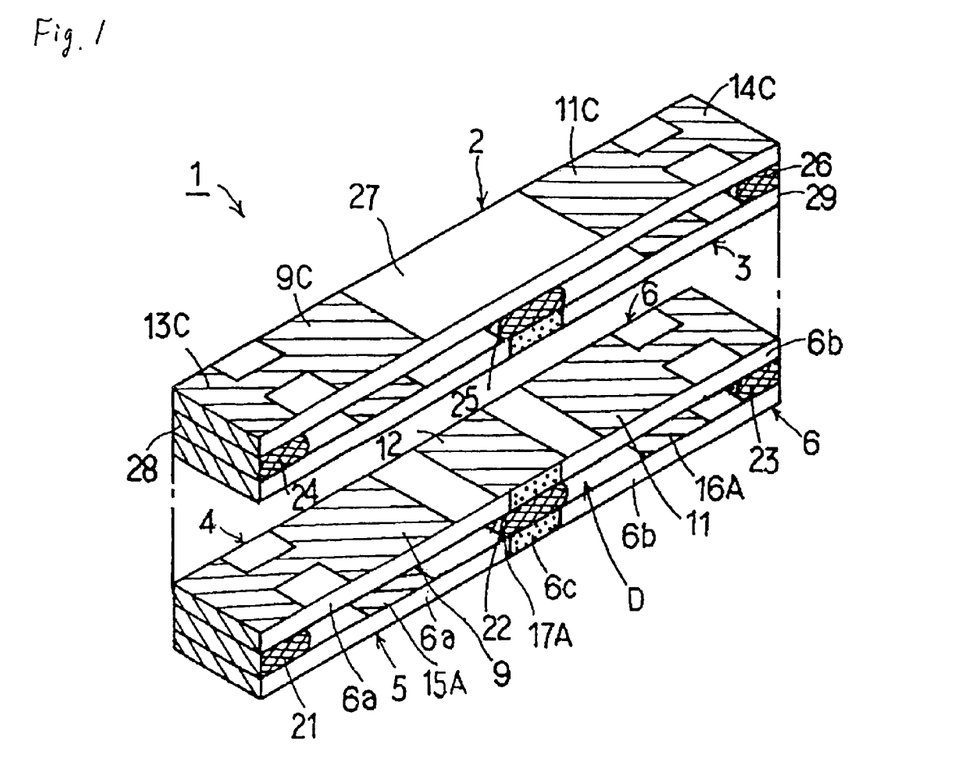
FIG. 1 is an assembly view illustrating a composite piezoelectric component according to a first preferred embodiment of the present invention.

FIG. 1 is an assembly view for showing a composite piezoelectric component according to a preferred embodiment of the present invention.

The composite piezoelectric component 1 has a structure defined by stacking of a plurality of piezoelectric resonant elements 2–5. Note that the piezoelectric resonant element 2 is deposited on the top of the component.

The piezoelectric resonant element 4 will be described with reference to FIGS. 2A–2C.

Figure 2A:
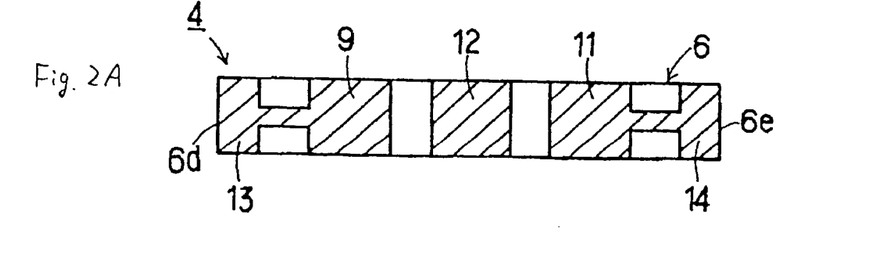
Figure 2B:
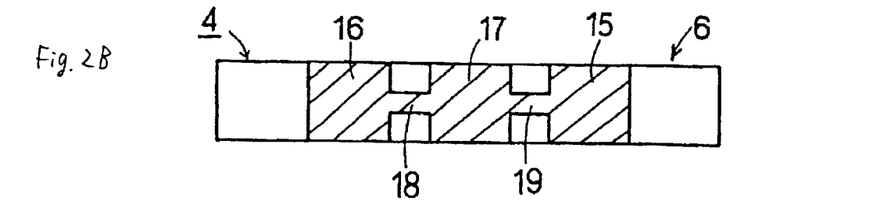
Figure 2C:
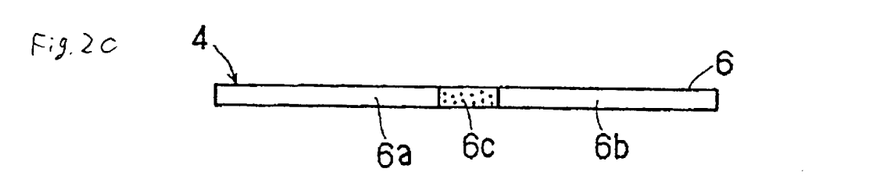

FIGS. 2A, 2B and 2C are a plan view, a bottom plan view and a side view of the piezoelectric resonant element 4, respectively.

The piezoelectric resonant element 4 preferably includes a long, narrow substantially rectangular substrate 6. The substrate 6 has a structure in which piezoelectric substrate portions 6a and 6b are joined together via a conductive material portion 6c arranged in the approximate center thereof.

Figure 3A:
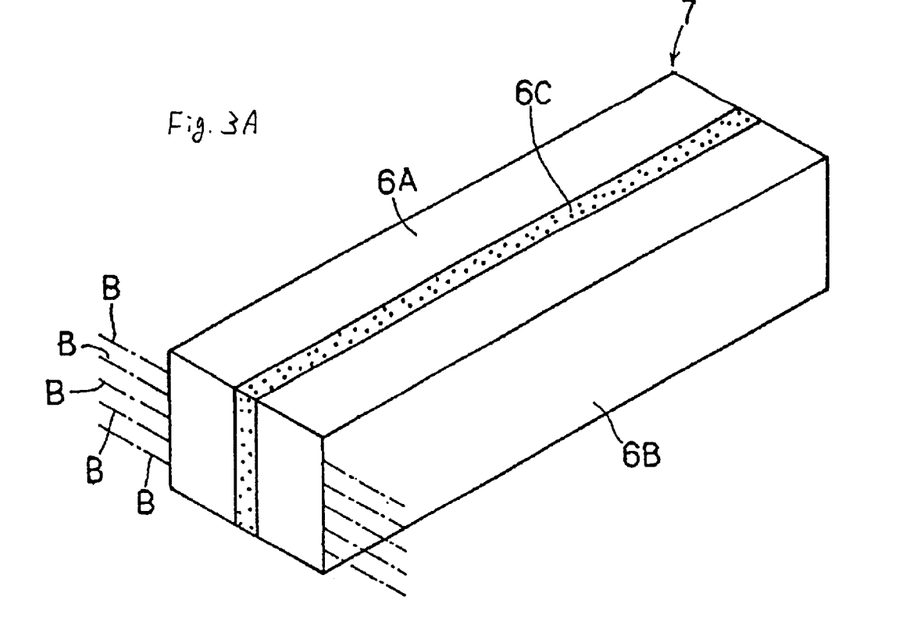

The substrate 6 can be easily manufactured by the following method. That is, as shown in FIG. 3A, a substantially rectangular piezoelectric block 6A and a substantially rectangular piezoelectric block 6B having substantially the same shape as the piezoelectric block 6A are joined together via conductive adhesive 6C such as conductive paste or other joining material in order to obtain a substantially rectangular mother block 7. Then, the mother block 7 is sliced along the alternating long and short dash lines "B" in FIG. 3A. That is, the mother block 7 is cut in a direction that is substantially perpendicular to the extending direction of the conductive adhesive 6C.

Figure 3B:
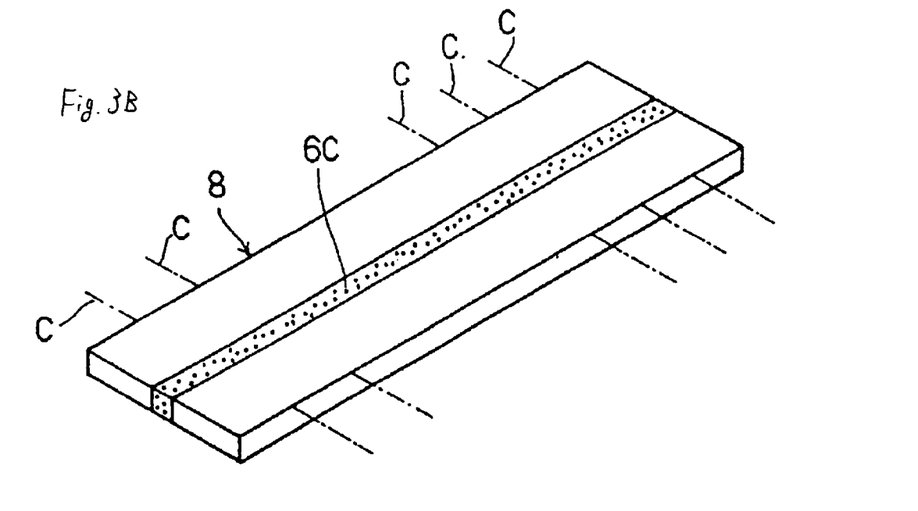

A plate-shaped mother substrate 8 shown in FIG. 3B can be formed as described above. The substrates 6 can be obtained by cutting the mother substrate 8 along the alternating long and short dash lines "C" in FIG. 3B.

As shown in FIG. 2A, in the substrate 6, vibrating electrodes 9 and 11 are provided on the top surfaces of the piezoelectric substrate portions 6a and 6b, respectively. A ground electrode 12 is disposed on the intermediate portion between the regions on which the vibrating electrodes 9 and 11 are located, i.e., the center of the substrate 6.

The vibrating electrodes 9 and 11 are electrically connected to terminal electrodes 13 and 14 arranged along respective edges which are defined by side surfaces 6d and 6e of the substrate 6 and the top surface thereof.

The ground electrode 12 is arranged to cover the top surface of the conductive material portion 6c. Even so, the ground electrode 12 is not necessarily arranged to cover the entire region of the top surface of the conductive material portion 6c as long as it is electrically connected to the conductive material portion 6c.

As shown in FIG. 2B, on the bottom surface of the substrate 6, vibrating electrodes 15 and 16, and a ground electrode 17 are provided. The vibrating electrode 15 opposes the vibrating electrode 9 disposed on the top surface of the substrate 6 at the front and the back of the substrate 6. Also, the vibrating electrode 16 opposes the vibrating electrode 11 at the front and the back of the substrate 6.

In other words, a first piezoelectric vibrating unit is defined by the vibrating electrodes 9 and 15, while a second piezoelectric vibrating unit is defined by the vibrating electrodes 11 and 16.

In this preferred embodiment, the piezoelectric substrate portions 6a and 6b preferably include a lead-zirconate-titanate base ceramic, and are polarized substantially parallel to the main surface direction. Therefore, the piezoelectric vibrating unit is excited in the shear vibration mode. Since the piezoelectric vibrating unit is defined on the portion of the substrate 6, each piezoelectric vibrating unit defines an energy-confining-type piezoelectric vibrating unit.

The ground electrode 17 is preferably located at the approximate center of the bottom surface of the substrate 6.

Therefore, the ground electrode 17 is electrically connected to the above-mentioned conductive material portion 6c.

The ground electrode 17 is also electrically connected to the vibrating electrodes 15 and 16 via connecting conductive portions 18 and 19.

Since the piezoelectric resonant element 4 is arranged and has the structure described above, when the ground electrodes 12 and 17 are connected to a ground and an input voltage is applied to the terminal electrode 13, the element functions as a double-mode piezoelectric resonator having the same resonant frequencies.

The piezoelectric resonant element 5 is preferably constructed similar to the piezoelectric resonant element 4. Even so, the piezoelectric resonant element 5 defines a second trap element and is a double-mode resonator having different resonant frequencies from those of a first trap element.

Figure 2D:
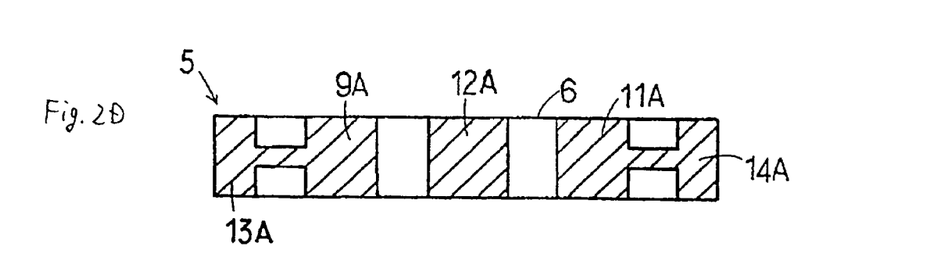
FIG. 2D and FIG. 2E are a plan view and a bottom plan view for illustrating the structure of an electrode of another piezoelectric resonator, respectively.
Figure 2E:
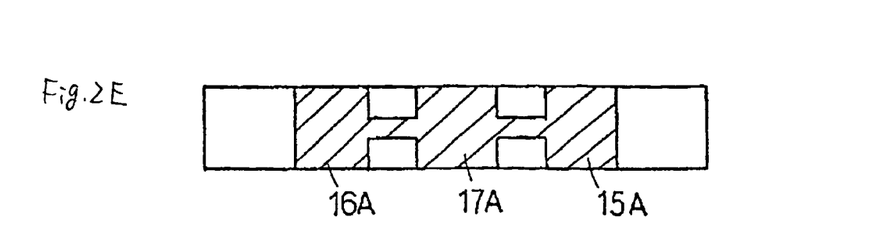

That is, as shown in FIG. 2D, in the piezoelectric resonant element 5, the areas of the vibrating electrodes 9A and 11A located on the substrate 6 are the same, but are different from those of the respective vibrating electrodes 9, 11, 15, and 16 of the piezoelectric resonant element 4 defining the first trap element. In addition, as shown in FIG. 2E, the vibrating electrodes 15A and 16A disposed on the bottom surface of the substrate 6 oppose the vibrating electrodes 9A and 11A at the front and the back of the substrate and cover substantially the same areas as those of the vibrating electrodes 9A and 11A, respectively. The vibrating electrodes 16A and 15A are electrically connected to the ground electrode 17A.

Therefore, in the piezoelectric resonant element 5, when the ground electrode 12A is connected to a ground and an input voltage is applied to the terminal electrode 13A, trap characteristics different from those obtained from the piezoelectric resonant element 4 can be obtained from the terminal electrode 14A.

In order to change the resonant frequencies from those of the first trap element to those of the second trap element, the areas of the vibrating electrodes are changed from those of the first trap element to those of the second trap element and/or the thickness of the substrate defining the first trap element is changed to that of the substrate defining the second trap element.

One of the advantageous features of the composite piezoelectric component 1 according to this preferred embodiment is that the piezoelectric resonant elements 4 and 5 are defined by respective substrates 6 having conductive material portions 6c described above.

As shown in FIG. 1, the piezoelectric resonant element 4 and the piezoelectric resonant element 5 are joined together via conductive joining members 21 to 23 such as conductive paste or other suitable joining material. When joining, the piezoelectric resonant elements 4 and 5 are stacked such that electrodes of the piezoelectric resonant elements 4 and 5 for establishing a connection to a ground oppose each other. That is, the vibrating electrodes 15 and 16, and the ground electrode 17 oppose the vibrating electrodes 15A and 16A, and the ground electrode 17A, respectively.

Accordingly, the ground electrode 17 (see FIG. 2B) of the piezoelectric resonant element 4 is electrically connected to the ground electrode 17A (see FIG. 2E) of the piezoelectric resonant element 5 via a conductive joining member 22.

In addition, in order to secure a gap "D" for allowing for unhindered and free vibration of each piezoelectric vibrating unit in the piezoelectric resonant elements 4 and 5, each of the conductive joining members 21 to 23 has a thickness that is sufficient to secure the gap as shown in FIG. 1.

Although FIG. 1 shows it being separated upward, on the top of the piezoelectric resonant element 4, the piezoelectric resonant element 3 which has a construction similar to the piezoelectric resonant element 5 is stacked so as to face the vibrating electrodes for being connected to a ground and the ground electrode extends upwardly just like the piezoelectric resonant element 5. Although not shown in FIG. 1, the piezoelectric resonant element 3 is joined to the piezoelectric resonant element 4 via conductive joining members (not shown). On the top of the piezoelectric resonant element 3, the piezoelectric resonant element 2 is joined via conductive joining members 24 to 26. The piezoelectric resonant element 2 is defined by a piezoelectric substrate 27 that is different from the piezoelectric resonant elements 3 to 5. As for materials for the piezoelectric substrate 27, a piezoelectric ceramic or a piezoelectric single-crystal can be used just like piezoelectric substrate portions 6a and 6b.

The piezoelectric resonant element 2 is preferably identical to the piezoelectric resonant element 4 except that the piezoelectric substrate 27 is used instead of the substrate 6 and the ground electrode is not provided on the top surface of the piezoelectric substrate 27.

In other words, vibrating electrodes 9C and 11C are arranged on the top surface of the piezoelectric resonant element 2 so as to cover an equal area. The vibrating electrodes 9C and 11C are electrically connected to terminal electrodes 13C and 14C, respectively. The terminal electrodes 13C and 14C are arranged so as to extend not only to the top surface of the piezoelectric substrate 27 but also to the side surfaces thereof.

On the bottom surface of the piezoelectric resonant element 2, vibrating electrodes are arranged so as to oppose the vibrating electrodes 9C and 11C at the front and the back of the substrate although they are not shown in the drawing. Furthermore, at the approximate center of the bottom surface of the piezoelectric substrate 27, a ground electrode (not shown) is arranged so as to be electrically connected to the conductive joining member 25. This ground electrode is electrically connected to the pair of vibrating electrodes provided on the bottom surface.

Therefore, in the composite piezoelectric component 1, electrodes connected to a ground of the plural piezoelectric resonant elements 2 to 5 which are stacked on each other are electrically connected to each other through the conductive material portions 6c and the conductive joining members 22 and 25. More specifically, the ground electrode located on the bottom surface of the piezoelectric resonant element 2 is electrically connected to the ground electrode formed on the top surface of the piezoelectric resonant element 3 via the conductive joining member 25. The ground electrode disposed on the top surface of the piezoelectric resonant element 3 is electrically connected to the ground electrode (not shown) disposed on the bottom surface of the piezoelectric resonant element 3 via the conductive material portion 6c. The ground electrode disposed at the approximate center of the bottom surface of the piezoelectric resonant element 3 is electrically connected to the ground electrode 12 provided on the top surface of the piezoelectric resonant element 4 via the conductive joining member (not shown). Likewise, the ground electrode 12 is electrically connected to the ground electrode 12A provided on the bottom surface of the piezoelectric resonant element 5 shown in FIG. 1 via the conductive material portion 6c, the ground electrode 17, the conductive joining member 22, the ground electrode 17A, and the conductive material portion 6c.

Consequently, according to the composite piezoelectric component 1 of this preferred embodiment, since in the stacked structure of the four plate-shaped piezoelectric resonant elements 2–5, the piezoelectric resonant elements 3–5 are defined by the substrates 6 having the conductive material portions 6c except for the piezoelectric resonant element 2 located on the top. Electrodes 12, 17, 12A, of each piezoelectric resonant element which are arranged to be connected to a ground are securely electrically connected by only the deposition of the piezoelectric resonant elements 2–5 via the conductive joining members.

On the other hand, as for the vibrating electrodes 9, 11, 9A, 11A, 9C, and 11C provided on the top surface of the piezoelectric resonant elements 2–5, each terminal electrode connected to each vibrating electrode is electrically connected to one another by connecting electrodes 28 and 29 provided on both end surfaces of the deposited structure.

In addition, the connecting electrodes 28 and 29 may be formed by applying a metal or an alloy by means of vapor deposition, sputtering, or other suitable process.

A multistage composite trap is formed by stacking the piezoelectric resonant elements 2–5. As a result of the unique arrangement, a large area for electrical connections of the plural piezoelectric resonant elements is not required. That is, the connections of at least electrodes connected to a ground is achieved by portions of the substrates themselves, so that miniaturizing of the composite piezoelectric component 1 is achieved.

Furthermore, since the ground electrodes are connected to one another via using the conductive joining members 22 and 25, the reliability of electrical connections of the piezoelectric resonant elements is greatly improved.

Figure 4:
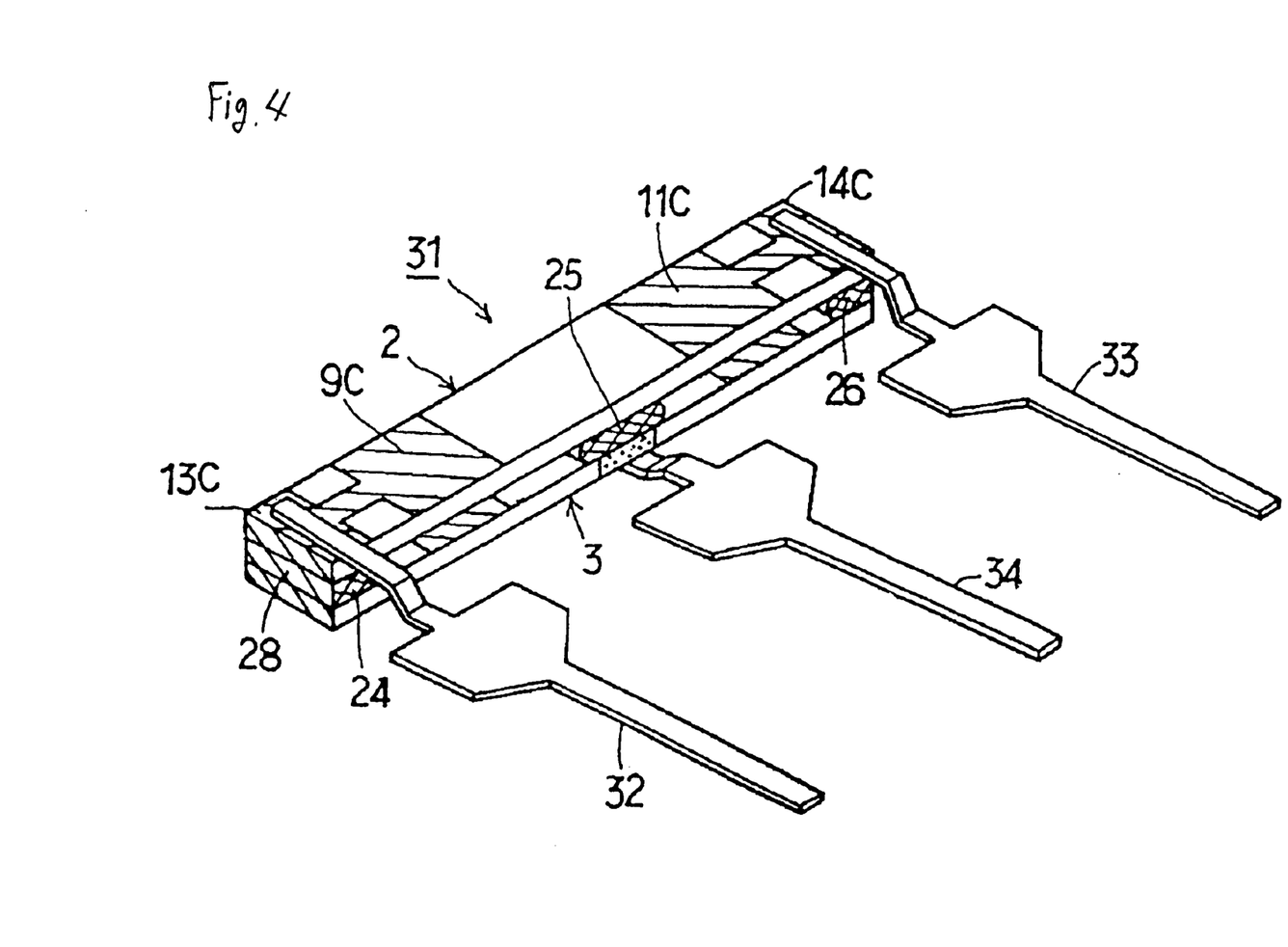
FIG. 4 is a perspective view showing a composite piezoelectric component defining a composite trap including leads according to a second preferred embodiment of the present invention.

FIG. 4 is a perspective view showing a composite trap including leads and which defines a composite piezoelectric component according to a second preferred embodiment of the present invention.

In a composite piezoelectric component 31, the piezoelectric resonant elements 2 and 3 included in the first preferred embodiment are stacked on each other similar to the first preferred embodiment. Therefore, as for the piezoelectric resonant elements 2 and 3, and the conductive joining members 24 to 26, the detailed description thereof is omitted in view of its similarity to that of the first preferred embodiment.

In the composite piezoelectric component 31 of this preferred embodiment, the piezoelectric resonant element 2 also defines a first trap element including a double-mode piezoelectric resonator having the same resonant frequencies, while the piezoelectric resonant element 3 defines a second trap element including a double-mode piezoelectric resonator having resonant frequencies different from those of the first trap element.

For the purpose of obtaining an electronic component including leads, the terminal electrodes 13C and 14C are joined to lead terminals 32 and 33 by soldering, for example, respectively. The ground electrode located on the bottom surface of the piezoelectric resonant element 3 is joined to a lead terminal 34 by soldering, for example.

The component except for an extended portion of the lead terminals 32 to 34 is covered by an exterior resin to obtain a resin-molded-type electronic component with leads.

When the exterior resin is covered, it is required that vibration of piezoelectric vibrating units in the piezoelectric resonant elements 2 and 3 not be disturbed. Therefore, the inside of the exterior resin may be coated by pliable silicone rubber during forming the covering layer, i.e., the exterior resin.

The composite piezoelectric component according to preferred embodiments of the present invention may be an electronic component having leads as described above or may be formed as a chip-type composite piezoelectric component having no lead terminals.

Figure 5:
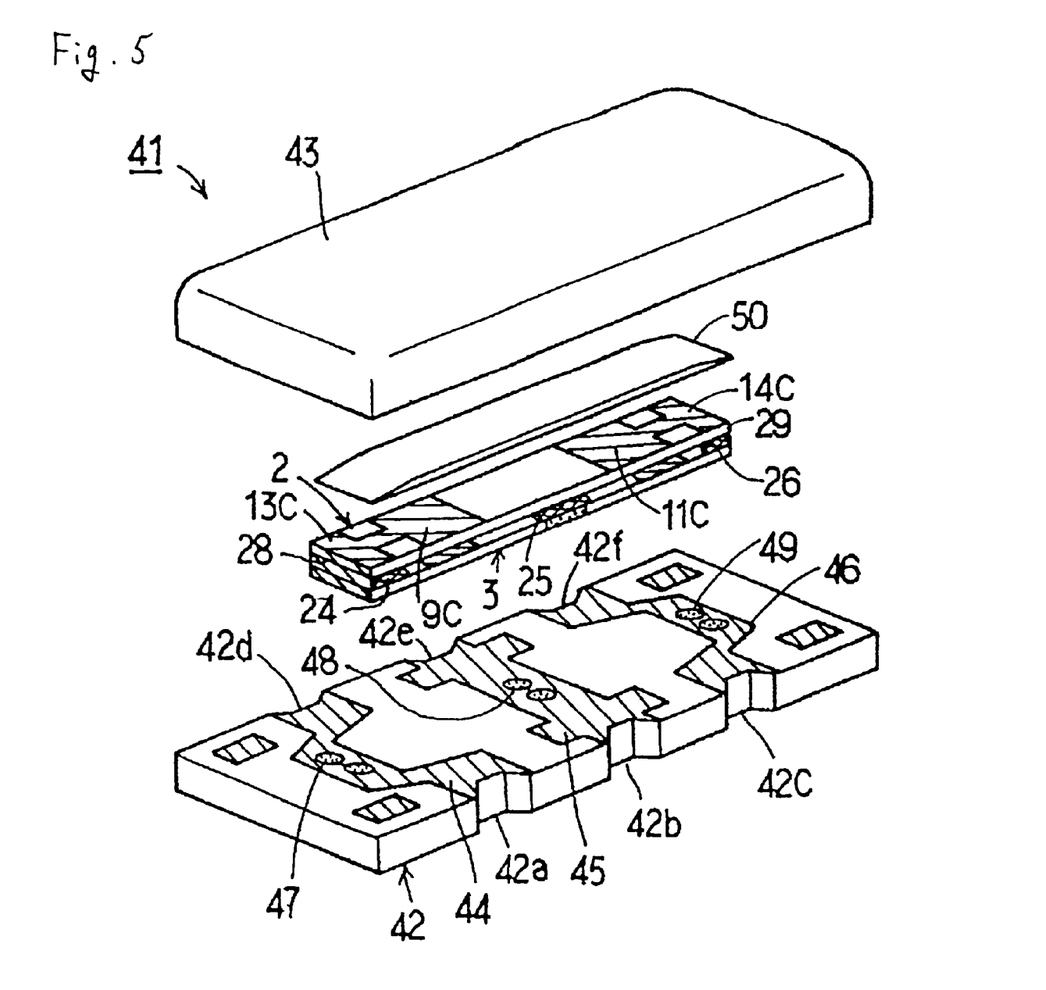
FIG. 5 is an assembly view showing a chip-type composite piezoelectric component according to a third preferred embodiment of the present invention.

FIG. 5 is an assembly view showing a chip-type composite piezoelectric component according to a third preferred embodiment of the present invention.

The package of a composite piezoelectric component 41 includes a case substrate 42 which defines a first case member and a cap 43 which defines a second case member. Within this package, a composite trap obtained by stacking of the piezoelectric resonant elements 2 and 3 similar to the second preferred embodiment is provided.

The case substrate 42 preferably is a substantially rectangular insulating substrate. In a pair of side surfaces opposing each other of the case substrate 42, notches 42a to 42c and notches 42d to 42f are provided, respectively.

On the top surface of the case substrate 42, electrodes 44 to 46 are disposed. The electrode 44 is arranged so as to extend in the lateral direction of the case substrate 42 to the notches 42a and 42d. Likewise, the electrodes 45 and 46 are arranged so as to extend in the lateral direction of the case substrate 42 to the notches 42b and 42e, and the notches 42c and 42f, respectively.

The composite trap is mounted on the case substrate 42 with the piezoelectric resonant element 3 located face down. During mounting, the piezoelectric resonant element 3 is joined by conductive joining members 47 to 49 such as conductive paste. By the conductive joining member 47, the connecting electrode 28 is electrically connected to the electrode 44. The ground electrode located at the approximate center of the bottom surface of the piezoelectric resonant element 3 is electrically connected to the electrode 45 via the conductive joining member 48.

Furthermore, the connecting electrode 29 is electrically connected to the electrode 46 via the conductive joining member 49.

The cap 43 is joined to the case substrate 42 so as to surround the composite trap. The cap 43 may be made of a conductive material or an insulating material.

When the cap 43 is made of a conductive material, the composite trap inside is electromagnetically shielded.

However, when the cap 43 is made of a conductive material, it is desirable that in order to break conduction between the electrodes 44 and 46, and the cap 43, a substantially rectangular insulating thin-film is provided on the top surface of the case substrate 42 and the cap 43 is joined on the insulating thin-film using an insulating adhesive.

When the cap 43 is made of an insulating material, it may be joined to the case substrate 42 by using an appropriate insulating adhesive.

In order to improve electromagnetic shielding, it is desirable that the cap 43 be electrically connected to the electrode 45.

In the composite piezoelectric-component 41 of this preferred embodiment, the composite trap is accommodated inside the package defined by the case substrate 42 and the cap 43 as described above, and the electrical connection outside can be performed by using the electrodes 44 to 46 which extend to the notches 42a to 42f located on the side surfaces of the case substrate 42.

Therefore, this component can be easily surface-mounted on a printed-circuit board or other substrates, just like ordinary chip-type electronic components.

In addition, numeral 50 denotes a damping layer formed of a material having rubber-like elasticity such as a silicone rubber. The damping layer 50 is not necessarily but, by coating a material having rubber-like elasticity after mounting the composite trap on the case substrate 42 to form the damping layer 50, additional spurious vibrations are damped thereby providing even better characteristics.

In each of the preferred embodiments described above, the piezoelectric resonant element deposited on the top surface preferably includes a piezoelectric substrate made of a single piezoelectric material. However, the piezoelectric resonator element may have a structure in which the first and second piezoelectric substrate portions are joined together via the conductive material portion even in the substrate located on the top.

Furthermore, in preferred embodiments of the present invention, the substrate defined by the plurality of piezoelectric substrate portions which are joined via the conductive material portions is not limited to the substrate shown in each preferred embodiment described above. That is, when a plural of ground electrodes are disposed on one of principal surfaces of the substrate, and so forth, two or more conductive material portions may be provided in the substrate.

In the preferred embodiments described above, the composite trap utilizing a shear vibration mode is described. However, another vibration mode such as a thickness vibration mode may be used in the present invention. The structures of the vibrating electrode defining the piezoelectric vibration unit in each piezoelectric resonant element are also not limited to the preferred embodiments illustrated in the drawings and the present invention can be applied to a multistage piezoelectric filter or other types of filters.

While the invention has been particularly shown and described with reference to preferred embodiments thereof, it will be understood by those skilled in the art that the forgoing and other changes in form and details may be made therein without departing from the spirit of the invention.

What is claimed is:

1. A composite piezoelectric component comprising:
    a plurality of piezoelectric resonant elements each including a substrate having a first major surface and a second major surface disposed opposite to each other, at least two vibrating electrodes disposed on the first and second major surfaces, respectively, so that one of the at least two vibrating electrodes disposed on the first major surface opposes the other of the at least two vibrating electrodes disposed on the second major surface with the substrate disposed therebetween, a ground electrode connected to ground and disposed on at least one of the first and second major surfaces, and each of the plurality of piezoelectric resonant elements being stacked on each other so that the major surface of one substrate opposes the major surface of another substrate;
    conductive joining members arranged to electrically connect at least two of the vibrating electrodes and the ground electrodes of stacked adjacent ones of the plurality of piezoelectric resonant elements and to mechanically bond the stacked adjacent ones of the piezoelectric resonant elements;
    each of the substrates of the piezoelectric resonant elements other than the piezoelectric resonant element located on the top of the composite piezoelectric component includes a plurality of piezoelectric substrate portions, a conductive material portion arranged between the plurality of piezoelectric substrate portions, the ground electrodes being provided on the first and second major surfaces of the substrate in the conductive material portion and the plurality of ground electrodes of the piezoelectric elements being electrically connected to one another via the conductive material portions and the conductive joining members, and the resonant element located on the top of the composite piezoelectric component includes a plurality of substrate portions, a conductive material portion arranged between the plurality of piezoelectric substrate portions, the resonant element located on the top of the composite piezoelectric component being joined to other piezoelectric resonant elements via the conductive joining members.

2. The composite piezoelectric component according to claim 1, wherein at least four piezoelectric resonant elements are stacked on each other such that the first and second major surfaces of each of the four piezoelectric elements are substantially parallel to the first and second major surfaces of the other of the four piezoelectric elements so as to define the composite piezoelectric component.

3. The composite piezoelectric component according to claim 1, wherein the substrate of each of the piezoelectric resonant elements have the same shape as that of the others of the piezoelectric resonant elements.

4. The composite piezoelectric component according to claim 3, wherein the shape is substantially rectangular.

5. The composite piezoelectric component according to claim 1, wherein the conductive material portion is arranged substantially in the center of the substrate.

6. The composite piezoelectric component according to claim 1, wherein at least one of the plurality of piezoelectric resonant elements is a first trap element including a double-mode ceramic resonator and at least one of the plurality of piezoelectric resonant elements is a second trap element including a double-mode ceramic resonator having a resonant frequency differing from that of the first trap element.

7. The composite piezoelectric component according to claim 6, wherein each of the first and second trap elements includes two pairs of vibrating electrodes disposed on the first and second major surfaces respectively so as to oppose each other with the substrate disposed therebetween.

8. The composite piezoelectric component according to claim 6, wherein a ground electrode disposed on at least one of the first and second major surfaces of the substrate, the ground electrode being electrically connected to the vibrating electrodes disposed on the same surface.

9. The composite piezoelectric component according to claim 8, wherein the substrate of the trap element located at the bottom surface in the first and second trap elements includes first and second piezoelectric substrate portions and the conductive material portion arranged between the first and second piezoelectric substrate portions, the ground electrode is disposed on the first and second major surfaces of the substrate in the conductive material portion and the corresponding terminal electrodes of the first and second trap elements are electrically connected to each other.

10. The composite piezoelectric component according to claim 8, further comprising a lead terminal joined to the terminal electrode and a lead terminal joined to the ground electrode.

11. The composite piezoelectric component according to claim 6, wherein a terminal electrode is electrically connected to the vibrating electrodes which are not connected to the ground.

12. A chip-type composite piezoelectric component comprising:

a first case member on which ha plurality of external electrodes are disposed;

a composite piezoelectric component including:

a plurality of piezoelectric resonant elements each including a substrate having a first major surface and a second major surface disposed opposite to each other, at least two vibrating electrodes disposed on the first and second major surfaces, respectively, so that one of the at least two vibrating electrodes disposed on the first major surface opposes the other of the at least two vibrating electrodes disposed on the second major surface with the substrate disposed therebetween, a ground electrode connected to ground and disposed on at least one of the first and second major surfaces, and each of the plurality of piezoelectric resonant elements being stacked on each other so that the major surface of one substrate opposes the major surface of another substrate;

conductive joining members arranged to electrically connect at least two of the vibrating electrodes and the ground electrodes of stacked adjacent ones of the plurality of piezoelectric resonant elements and to mechanically bond the stacked adjacent ones of the piezoelectric resonant elements;

each of the substrates of the piezoelectric resonant elements other than the piezoelectric resonant element located on the top of the composite piezoelectric component includes a plurality of piezoelectric substrate portions, a conductive material portion arranged between the plurality of piezoelectric substrate portions, the ground electrodes being provided on the first and second major surfaces of the substrate in the conductive material portion and the plurality of ground electrodes of the piezoelectric elements being electrically connected to one another via the conductive material portions and the conductive joining members, and the resonant element located on the top of the composite piezoelectric component includes a plurality of substrate portions, a conductive material portion arranged between the plurality of piezoelectric substrate portions, the resonant element located on the top of the composite piezoelectric component being joined to other piezoelectric resonant elements via the conductive joining members; and a second case member joined to said first case member so as to surround the composite piezoelectric component mounted on the first case member.

13. The chip-type composite piezoelectric component according to claim 12, wherein at least four piezoelectric resonant elements are stacked on each other such that the first and second major surfaces of each of the four piezoelectric elements are substantially parallel to the first and second major surfaces of the other of the four piezoelectric elements so as to define the composite piezoelectric component.

14. The chip-type composite piezoelectric component according to claim 12, wherein the substrate of each of the piezoelectric resonant elements have the same shape as that of the others of the piezoelectric resonant elements.

15. The chip-type composite piezoelectric component according to claim 12, wherein the conductive material portion is arranged substantially in the center of the substrate.

16. The chip-type composite piezoelectric component according to claim 12, wherein at least one of the plurality of piezoelectric resonant elements is a first trap element including a double-mode ceramic resonator and at least one of the plurality of piezoelectric resonant elements is a second trap element including a double-mode ceramic resonator having a resonant frequency differing from that of the first trap element.

17. The chip-type composite piezoelectric component according to claim 16, wherein each of the first and second trap elements includes two pairs of vibrating electrodes disposed on the first and second major surfaces respectively so as to oppose each other with the substrate disposed therebetween.

18. The chip-type composite piezoelectric component according to claim 16, wherein a ground electrode disposed on at least one of the first and second major surfaces of the substrate, the ground electrode being electrically connected to the vibrating electrodes disposed on the same surface.

19. The chip-type composite piezoelectric component according to claim 18, wherein the substrate of the trap element located at the bottom surface in the first and second trap elements includes first and second piezoelectric substrate portions and the conductive material portion arranged between the first and second piezoelectric substrate portions, the ground electrode is disposed on the first and second major surfaces of the substrate in the conductive material portion and the corresponding terminal electrodes of the first and second trap elements are electrically connected to each other.

20. The chip-type composite piezoelectric component according to claim 18, further comprising a lead terminal joined to the terminal electrode and a lead terminal joined to the ground electrode.

21. The chip-type composite piezoelectric component according to claim 16, wherein a terminal electrode is electrically connected to the vibrating electrodes which are not connected to the ground.

* * * * *

UNITED STATES PATENT AND TRADEMARK OFFICE
CERTIFICATE OF CORRECTION

PATENT NO. : 6,351,055 B1
DATED : February 26, 2002
INVENTOR(S) : Tomoaki Futakuchi and Hisayuki Hishimoto It is certified that error appears in the above-identified patent and that said Letters Patent is hereby corrected as shown below:

<u>Title page,</u>
Item [73], Assignee, should be -- Murata Manufacturing Co., Ltd. --

Signed and Sealed this

Eighteenth Day of May, 2004

JON W. DUDAS
*Acting Director of the United States Patent and Trademark Office*